(12) United States Patent
Yu et al.

(10) Patent No.: US 8,822,293 B2
(45) Date of Patent: Sep. 2, 2014

(54) SELF-ALIGNED HALO/POCKET IMPLANTATION FOR REDUCING LEAKAGE AND SOURCE/DRAIN RESISTANCE IN MOS DEVICES

(75) Inventors: Chen-Hua Yu, Hsin-Chu (TW); Yihang Chiu, Toufen (TW); Shu-Tine Yang, Jhubei (TW); Jyh-Cherng Sheu, Hsin-Chu (TW); Chu-Yun Fu, Hsin-Chu (TW); Cheng-Tung Lin, Jhudong (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1404 days.

(21) Appl. No.: 12/048,119

(22) Filed: Mar. 13, 2008

(65) Prior Publication Data

US 2009/0233410 A1 Sep. 17, 2009

(51) Int. Cl.
  *H01L 21/336* (2006.01)
  *H01L 29/78* (2006.01)
  *H01L 21/265* (2006.01)
  *H01L 29/66* (2006.01)
  H01L 29/165 (2006.01)

(52) U.S. Cl.
  CPC ......... *H01L 29/7848* (2013.01); *H01L 29/7833* (2013.01); *H01L 29/165* (2013.01); *H01L 21/26586* (2013.01); *H01L 29/66537* (2013.01); *H01L 29/6659* (2013.01)
  USPC .................................. 438/291; 257/E21.443

(58) Field of Classification Search
  CPC .................. H01L 29/66492; H01L 29/66537; H01L 21/823412; H01L 21/823807
  USPC .................... 438/291; 257/E21.443, E21.618
  See application file for complete search history.

(56) References Cited

U.S. PATENT DOCUMENTS

| 5,114,868 | A | * | 5/1992 | Yoshida | 438/442 |
| 5,364,807 | A | * | 11/1994 | Hwang | 438/286 |
| 6,093,637 | A | * | 7/2000 | Kishimoto et al. | 438/624 |
| 6,362,062 | B1 | * | 3/2002 | Nandakumar | 438/303 |
| 6,396,103 | B1 | * | 5/2002 | Riccobene et al. | 438/291 |
| 6,432,781 | B2 | * | 8/2002 | Wasshuber | 438/291 |
| 6,569,606 | B1 | | 5/2003 | Wu et al. | |
| 6,579,751 | B2 | * | 6/2003 | Tran | 257/E21.618 |
| 6,596,598 | B1 | * | 7/2003 | Krivokapic et al. | 257/E21.443 |
| 6,855,984 | B1 | * | 2/2005 | Wu et al. | 257/E21.618 |
| 7,052,965 | B2 | * | 5/2006 | Park et al. | 438/302 |

(Continued)

FOREIGN PATENT DOCUMENTS

| CN | 101093804 A | | 12/2007 |
| JP | 2001-267562 | * | 9/2001 |
| JP | 2001267562 A | * | 9/2001 |

*Primary Examiner* — Stephen W Smoot
*Assistant Examiner* — Sun M Kim
(74) *Attorney, Agent, or Firm* — Slater and Matsil, L.L.P.

(57) ABSTRACT

A method of forming a semiconductor structure includes providing a semiconductor substrate; forming a gate dielectric over the semiconductor substrate, wherein the semiconductor substrate and a sidewall of the gate dielectric has a joint point; forming a gate electrode over the gate dielectric; forming a mask layer over the semiconductor substrate and the gate electrode, wherein a first portion of the mask layer adjacent the joint point is at least thinner than a second portion of the mask layer away from the joint point; after the step of forming the mask layer, performing a halo/pocket implantation to introduce a halo/pocket impurity into the semiconductor substrate; and removing the mask layer after the halo/pocket implantation.

18 Claims, 6 Drawing Sheets

(56) References Cited

U.S. PATENT DOCUMENTS

| | | | |
|---|---|---|---|
| 7,157,357 B2* | 1/2007 | Kim | 438/525 |
| 7,192,836 B1* | 3/2007 | Ghaemmaghami et al. | 438/291 |
| 7,419,863 B1* | 9/2008 | Bulucea | 257/E21.644 |
| 7,470,605 B2* | 12/2008 | Kim | 438/583 |
| 7,910,450 B2* | 3/2011 | Chinthakindi et al. | 438/382 |
| 2002/0137293 A1* | 9/2002 | Chen et al. | 438/291 |
| 2005/0151172 A1* | 7/2005 | Takemura et al. | 257/288 |
| 2007/0197042 A1* | 8/2007 | Brask | 438/753 |

* cited by examiner

SELF-ALIGNED HALO/POCKET IMPLANTATION FOR REDUCING LEAKAGE AND SOURCE/DRAIN RESISTANCE IN MOS DEVICES

TECHNICAL FIELD

This invention relates generally to semiconductor devices, and more particularly to the structure and fabrication methods of metal-oxide-semiconductor (MOS) devices.

BACKGROUND

With the scaling of integrated circuits, metal-oxide-semiconductor (MOS) devices are becoming increasingly smaller. The junction depths of the MOS devices are also reduced accordingly. This reduction causes technical difficulties during the formation processes. For example, small MOS devices demand high doping concentrations in source and drain regions in order to reduce sheet resistance in the source and drain regions. This results in the doping profiles to be more abrupt.

FIG. 1 schematically illustrates a cross-sectional view of an intermediate stage in the formation of a MOS device. Gate dielectric 4 and gate electrode 6 are formed on semiconductor substrate 2. Source/drain extension (SDE) regions 8 are formed in substrate 2 by vertically implanting an impurity. Halo/pocket regions 10 are also formed in substrate 2 by implanting an impurity having an opposite conductivity type than SDE regions 8. Preferably, halo/pocket regions 10 are tilt implanted so that they extend more into the channel region. Halo/pocket regions 10 also preferably extend deeper into substrate 2 than SDE regions 8. SDE regions 8 and halo/pocket regions 10 were typically formed using a same mask.

The formation methods shown in FIG. 1 suffer from drawbacks. With the increasing down-scaling of integrated circuits, SDE regions 8 and halo/pocket regions 10 became increasingly shallower. Accordingly, the doping concentrations of SDE regions 8 and halo/pocket regions 10 became more abrupt. This causes band-to-band tunneling leakages, which are the leakages between the source/drain regions (not shown) and substrate 2, to increase. Further, the band-to-band tunneling leakages may occur throughout the source/drain regions (from regions substantially under gate electrode 6 to regions away from gate electrode 6), further increasing the band-to-band tunneling leakage currents.

FIG. 2 schematically illustrates a profile of halo/pocket regions 10, wherein regions 12 represent where halo/pocket impurities are located. It is noted that the highest impurity concentration is in regions $12_1$, which are under the surface of substrate 2. The impurity concentration gradually decreases from regions $12_1$ to regions $12_2$, and to regions $12_3$. Since regions 12 overlap the source/drain regions, the net impurity concentration of source/drain regions will be offset by the implanted halo/pocket impurity. As a result, the source/drain resistance adversely increases.

Therefore, what is needed in the art is a new MOS device structure having reduced leakage currents and a reduced source/drain resistance, and manufacturing methods for forming the same.

SUMMARY OF THE INVENTION

In accordance with one aspect of the present invention, a method of forming a semiconductor structure includes providing a semiconductor substrate; forming a gate dielectric over the semiconductor substrate, wherein the semiconductor substrate and a sidewall of the gate dielectric has a joint point; forming a gate electrode over the gate dielectric; forming a mask layer over the semiconductor substrate and the gate electrode, wherein a first portion of the mask layer adjacent the joint point is at least thinner than a second portion of the mask layer away from the joint point; after the step of forming the mask layer, performing a halo/pocket implantation to introduce a halo/pocket impurity into the semiconductor substrate; and removing the mask layer after the halo/pocket implantation.

In accordance with another aspect of the present invention, a method of forming a semiconductor structure includes providing a semiconductor substrate; forming a gate dielectric over the semiconductor substrate, wherein the semiconductor substrate and a sidewall of the gate dielectric has a joint point; forming a gate electrode over the gate dielectric; blanket forming a mask layer; etching the mask layer to remove a first portion of the mask layer adjacent the joint point, wherein the joint point is exposed, and wherein a second portion of the mask layer away from the joint point remains; performing a halo/pocket implantation after the step of etching the mask layer; removing the mask layer after the halo/pocket implantation; and forming a source/drain extension (SDE) region.

In accordance with yet another aspect of the present invention, a semiconductor structure includes a semiconductor substrate; a gate dielectric over the semiconductor substrate; a gate electrode over the gate dielectric; a SDE region in the semiconductor substrate and adjacent the gate dielectric, wherein the SDE region comprises a first impurity of a first conductivity type; a halo/pocket region in the semiconductor substrate and adjacent the gate dielectric, wherein the halo/pocket region comprises a second impurity of a second conductivity type opposite the first conductivity type; and a source/drain region adjacent the gate dielectric. From a top surface of the source/drain region into the source/drain region, a concentration of the second impurity decreases substantially gradually.

In accordance with yet another aspect of the present invention, a semiconductor structure includes a semiconductor substrate; a gate dielectric on the semiconductor substrate; a gate electrode over the gate dielectric; a SDE region in the semiconductor substrate and adjacent the gate dielectric, wherein the SDE region is formed of a first impurity of a first conductivity type; a halo/pocket region in the semiconductor substrate and adjacent the gate dielectric, wherein the halo/pocket region is formed of a second impurity having a second conductivity type opposite the first conductivity type; and a source/drain region adjacent the gate dielectric. The concentration of the second impurity is the highest in a region close to an edge of the gate dielectric. From portions of the source/drain region close to the edge of the gate dielectric to portions of the source/drain region away from the edge of the gate dielectric, the concentration of the second impurity gradually decreases.

The advantageous features of the present invention include reduced source/drain and SDE sheet resistances and reduced band-to-band leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing embodiments of the present invention are provided. Throughout the various views and illustrative embodiments of the present invention, like reference numbers are used to designate like elements. In the following discussions, the formation of an exemplary n-type metal-oxide-semiconductor (NMOS) device is described to explain the concept of the present invention. However, the teaching of the present invention is readily applicable to the formation of PMOS devices.

Figure 1:
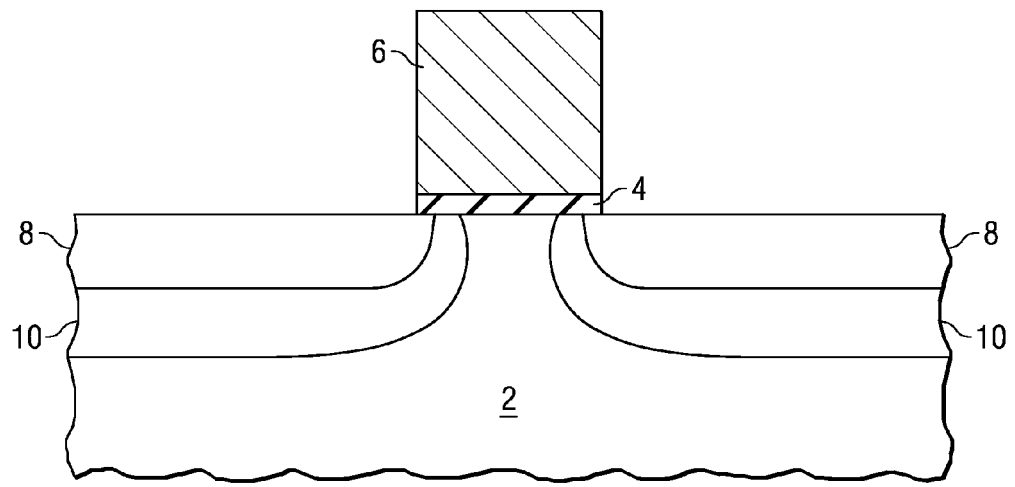
FIG. 1 illustrates a cross-sectional view of an intermediate stage in the formation of a conventional metal-oxide-semiconductor (MOS) device, wherein source/drain extension (SDE) regions and halo/pocket regions are formed using a same photoresist mask.
Figure 2:
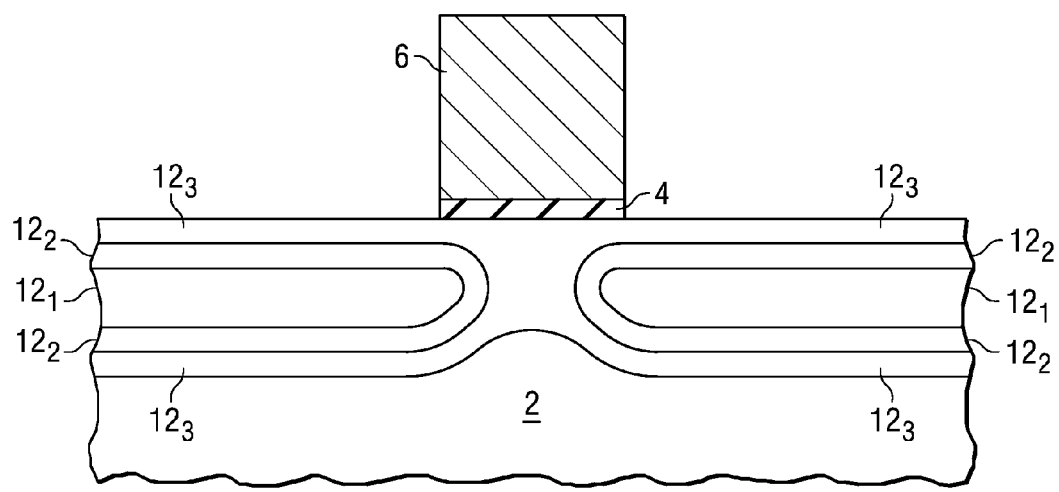
FIG. 2 illustrates a schematic profile of the impurity of a halo/pocket impurity.
Figure 3:
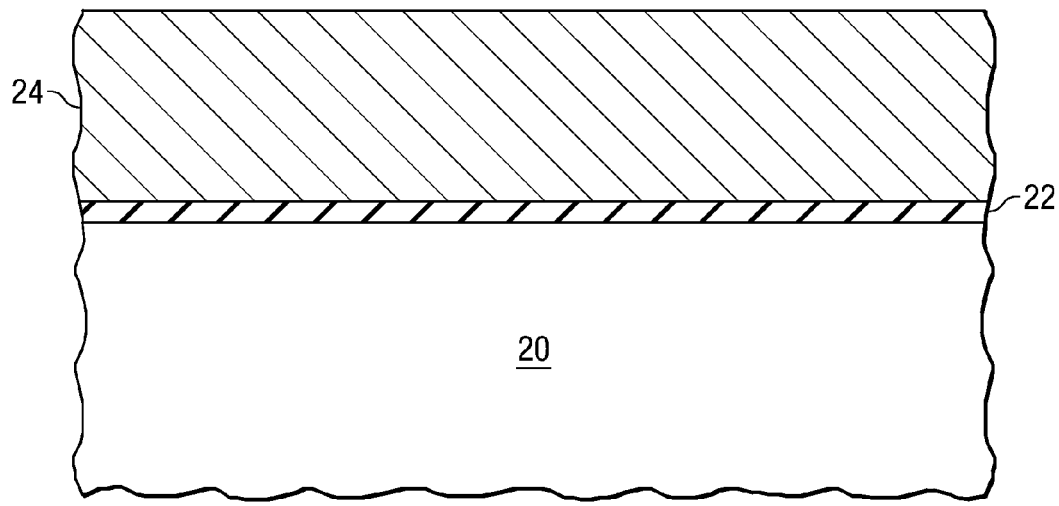
FIGS. 3 through 8 are cross-sectional views of intermediate stages in the manufacturing of an embodiment of the present invention.

FIG. 3 illustrates substrate 20, which may be formed of bulk silicon, although other commonly used structures and materials such as silicon-on-insulator (SOI), and silicon alloys, can be used. Semiconductor materials including other group III, group IV, and group V elements can also be used. Substrate 20 is preferably lightly doped with a p-type impurity. Alternatively, substrate 20 may be doped with an n-type impurity.

Referring again to FIG. 3, gate dielectric layer 22 is formed on substrate 20. In the preferred embodiment, gate dielectric layer 22 has a high dielectric constant (k value), preferably greater than about 3.9. The preferred materials in gate dielectric layer 22 include silicon oxides, silicon nitrides, silicon oxynitrides, metal oxides such as $HfO_2$, $HfZrO_x$, $HfSiO_x$, $HfFiO_x$, $HfAlO_x$, combinations thereof, and multi-layers thereof.

Figure 4:
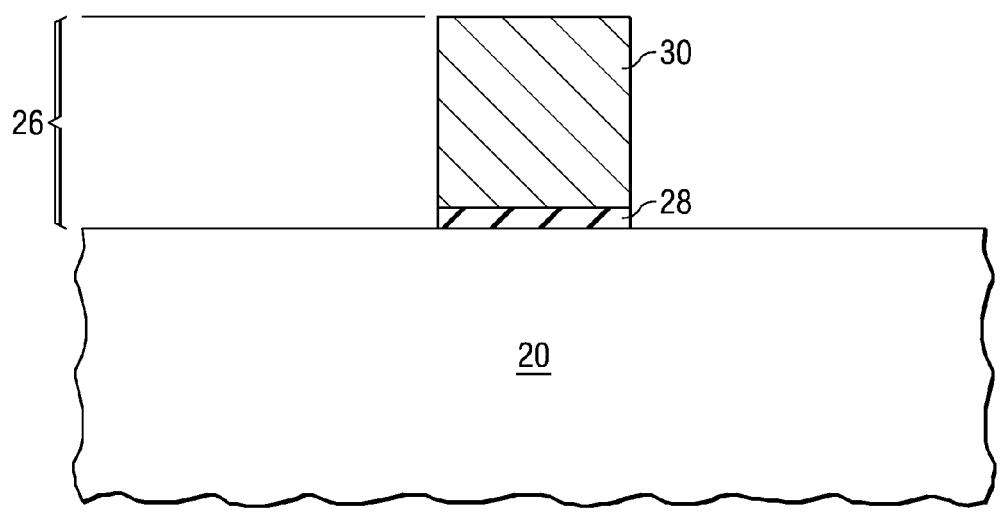

Gate electrode layer 24 is formed on gate dielectric layer 22. In one embodiment, gate electrode layer 24 includes polysilicon. Alternatively, gate electrode layer 24 includes other commonly used conductive materials such as metals, metal nitrides, metal silicides, and combinations thereof. The methods for forming gate dielectric layer 22 and gate electrode layer 24 include chemical vapor depositions (CVD) such as low temperature CVD (LTCVD), low pressure CVD (LPCVD), rapid thermal CVD (RTCVD), plasma enhanced CVD (PECVD), and other commonly used methods such as sputtering, physical vapor deposition (PVD), and the like. Gate electrode layer 24 and gate dielectric layer 22 are then patterned to form gate stack 26, which includes gate dielectric 28 and gate electrode 30, as is shown in FIG. 4.

Figure 5:
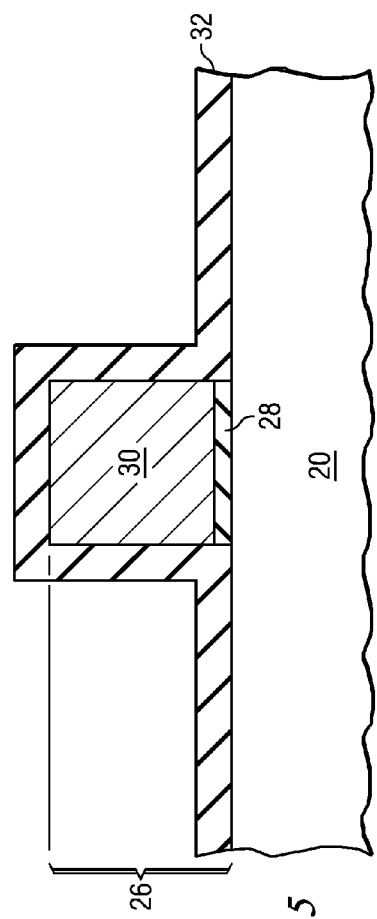

FIG. 5 illustrates the formation of hard mask 32. In the preferred embodiment, hard mask 32 is deposited using PECVD. Alternatively, other deposition methods such as atomic layer deposition (ALD), low-pressure chemical vapor deposition (LPCVD), and the like, may be used. Hard mask 32 may be formed of silicon nitride, silicon oxide, silicon oxynitride, and/or other materials suitable for masking purposes, and may have a composite structure having more than one layer of the above-described materials.

Figure 6A:
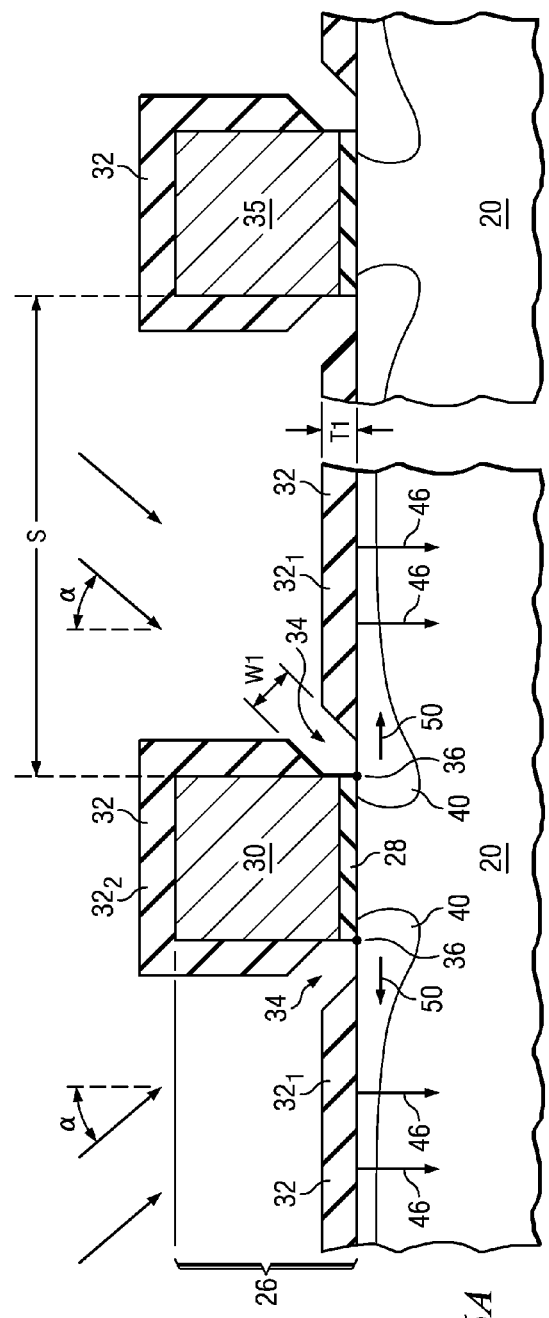

Referring to FIG. 6A, hard mask 32 is etched to form openings 34, wherein portions of hard mask 32 adjacent where the sidewalls of gate stack 26 join substrate 20 are removed. Preferably, the joint points 36 are exposed through openings 34. The portions of mask layer 32 away from joint points 36 preferably remain. For example, the horizontal portions $32_1$ and the portions $32_2$, which are on the top and sidewalls of gate stack 26 remain after the etching. The thickness T1 of portion $32_1$ is preferably great enough to at least substantially, preferably fully, mask the subsequent halo/pocket implantations. In an exemplary embodiment, thickness T1 is greater than about 28 nm. An exemplary width W1 of openings 34 is less than about ⅕ the spacing S between neighboring parallel gate poly strips 35.

In an exemplary embodiment wherein mask layer 32 is formed using PECVD, the portions of mask layer 32 adjacent joint points 36 are naturally less condense than portions $32_1$ and $32_2$. An isotropic etching will hence be able to cause the removal of portions of mask layer 32 adjacent joint points 36, while leaving portions $32_1$ and $32_2$. Mask portions $32_1$ and $32_2$, however, will also be thinned. Alternatively, openings 34 may be formed using other applicable methods, for example, by forming a photo resist to protect portions $32_1$ and $32_2$, and etching mask layer 32 through openings in the photo resist.

Next, as also shown in FIG. 6A, implantations are preformed to form halo/pocket regions 40, wherein a p-type impurity (referred to as halo/pocket impurity hereinafter), such as boron, indium, and combinations thereof, is introduced. In the preferred embodiment, the halo/pocket implantation is performed with a tilt angle α. The tilt angle α is preferably less than about 50 degrees, and more preferably between about 10 degrees and about 40 degrees.

With openings 34 in mask layer 32, the halo/pocket impurity penetrates into portions of substrate 20 close to joint points 36, forming halo/pocket regions 40. Since the implantations are tilted, halo/pocket regions 40 extend underlying gate electrode 30. In the preferred embodiment, mask layer 32 is thick enough to absorb at least a significant amount of the halo/pocket impurity. Accordingly, in the substrate regions under mask portions $32_1$, the highest concentration of the halo/pocket impurity is preferably in mask portions $32_1$ (and $32_2$). This desirable result may be obtained by adjusting the material, and/or the thickness T1 of mask portions $32_1$, and by adjusting the energy and species of the halo/pocket implantation. As a result, from the surface of substrate 20 into substrate 20 (in the direction of arrows 46), the concentration of the halo/pocket impurity gradually decreases. If mask portions $32_1$ are thick enough to absorb substantially all of implanted halo/pocket impurity, then it will also be observed that in the direction of arrows 50, the concentration of the halo/pocket impurity decreases substantially gradually.

Figure 6B:
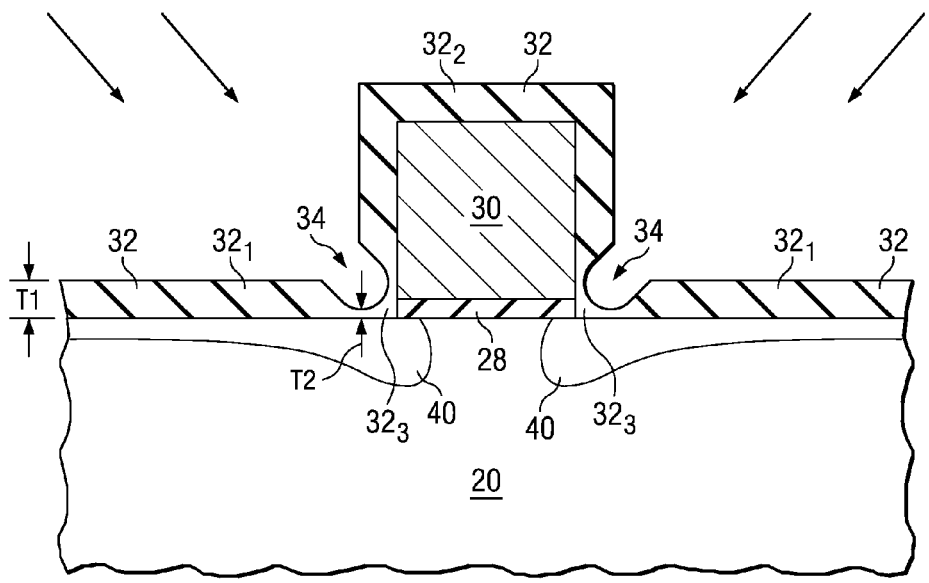

FIG. 6B illustrates an alternative embodiment of the present invention, in which the portions of mask layer 32 adjacent to joint points 36 are not fully removed. Instead, thin portions $32_3$ remain after the etching. Preferably, thickness T2 of mask portions $32_3$ is less than about 30 percent of thickness T1 of mask portions $32_1$, and more preferably less than about 25 percent of thickness T1. The remaining thickness T2 is smaller enough so that the implanted halo/pocket impurity may penetrate mask portions $32_3$ to form halo/pocket regions 40.

Figure 7:
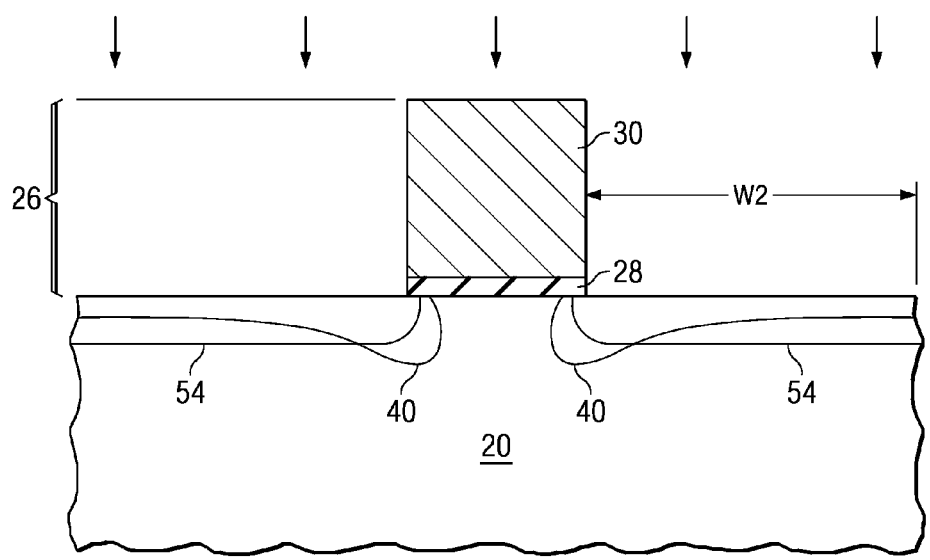

Referring to FIG. 7, mask layer 32 is removed, for example, using HF if mask layer 32 is formed of an oxide, or using $H_3PO_4$ if mask layer 32 is formed of a silicon nitride. The highly concentrated halo/pocket impurity, which is likely to have the highest concentration in mask layer 32, is also removed. This advantageously reduces the amount of the halo/pocket impurity remaining in the subsequently formed source and drain regions. FIG. 7 also illustrates the formation of source/drain extension (SDE) regions 54, which are often referred to as lightly doped source/drain (LDD) regions. An implantation is performed to introduce an n-type impurity into substrate 20. Preferably, the n-type impurity includes arsenic, phosphorous, or combinations thereof. Gate stack 26 acts as a mask so that SDE regions 54 are substantially aligned with the edges of gate stack 26.

Figure 8:
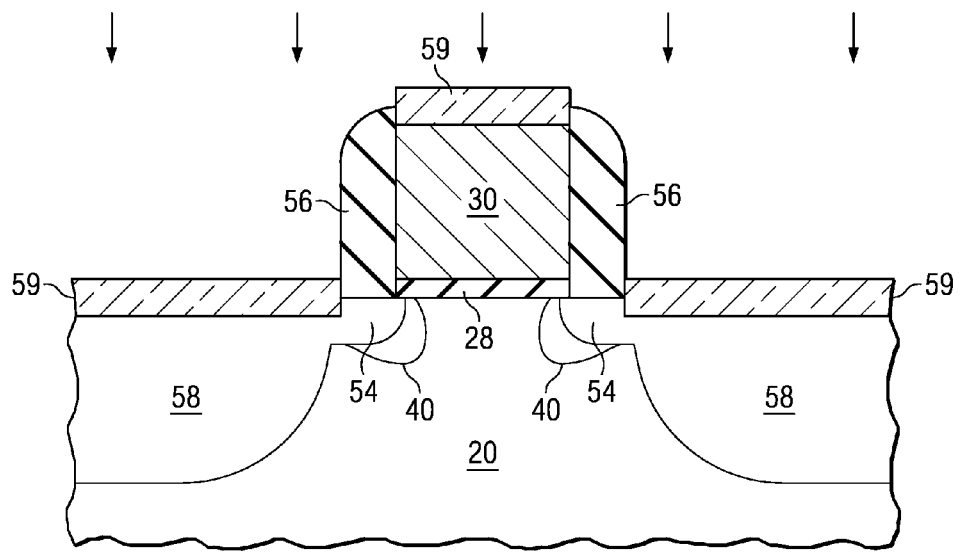

Gate spacers 56 are then formed, as shown in FIG. 8. As is known in the art, gate spacers 56 may be formed by blanket depositing one or more dielectric layer, and removing horizontal portions of the dielectric layer. The preferred methods for depositing the dielectric layer include PECVD, LPCVD, sub-atmospheric chemical vapor deposition (SACVD), and the like. In an exemplary embodiment, gate spacers 56 each include a silicon nitride layer on an oxide liner.

Next, source/drain regions 58 are formed, preferably by implanting an n-type impurity. Gate electrode 30 and gate spacers 56 act as masks so that the source/drain regions 58 are substantially aligned to the outer edges of gate spacers 56. The details for forming source/drain regions 58 are well known in the art, and hence are not repeated herein. Source/drain regions 58 have a much higher n-type impurity concentration than the halo/pocket impurity, and hence the p-type impurity in the source/drain regions 58 is neutralized.

Source/drain silicide regions 59 are formed on source/drain regions 58. As is known in the art, the formation of source/drain silicide regions 59 may include blanket forming a metal layer (not shown), performing an annealing to react the metal layer with silicon, and removing un-reacted metal portion of the metal layer.

Figure 9:
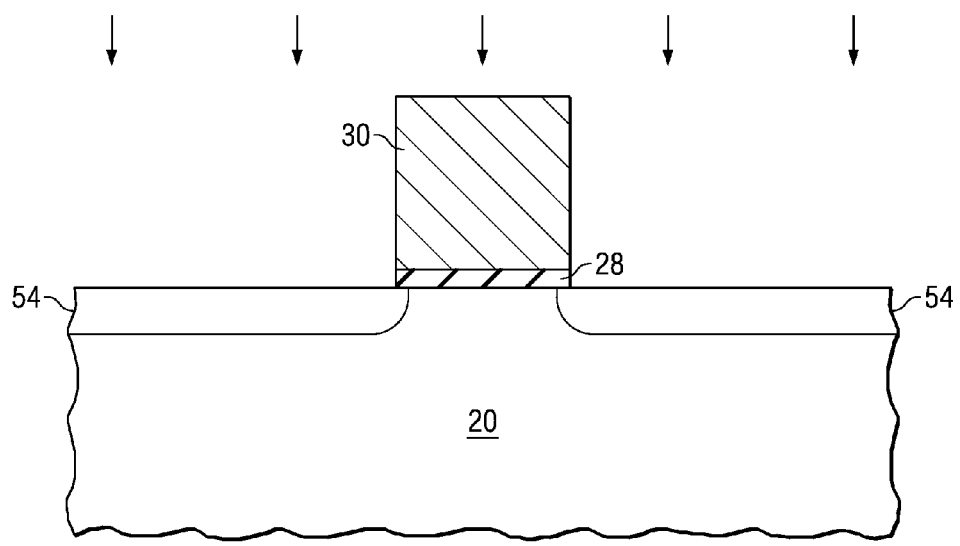
FIGS. 9 and 10 illustrate cross-sectional views of intermediate stages in the manufacturing of an alternative embodiment of the present invention, wherein SDE regions are formed before the formation of halo/pocket regions.
Figure 10:
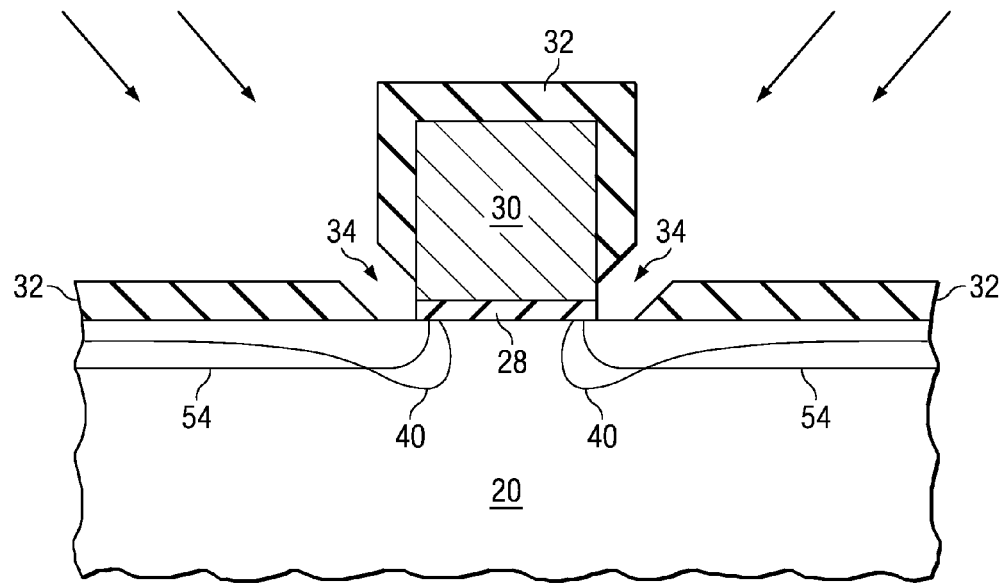

In the embodiments discussed in the preceding paragraphs, halo/pocket regions 40 are formed before the formation of SDE regions 54. FIGS. 9 and 10 illustrate an alternative embodiment, in which halo/pocket regions 40 are formed after the formation of SDE regions 54. The initial steps of this embodiment are essentially the same as shown in FIGS. 3 and 4. Next, as shown in FIG. 9, SDE regions 54 are formed, using essentially the same method and material as shown in FIG. 7. FIG. 10 illustrates the formation of mask layer 32 with openings 34 formed therein, followed by the halo/pocket implantation for forming halo/pocket regions 40. The materials and process steps are also essentially the same as shown in FIGS. 5, 6A, and 6B.

Figure 11:
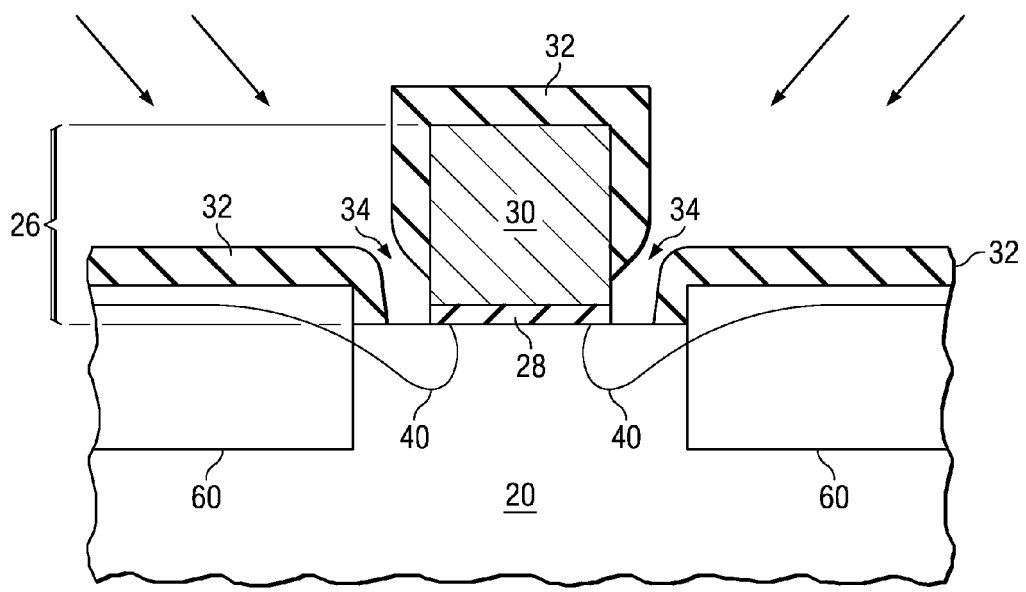
FIG. 11 illustrates a cross-sectional view of an intermediate stage in the manufacturing of an alternative embodiment of the present invention, in which stressors are formed.

FIG. 11 illustrates an intermediate stage in the formation of an alternative embodiment of the present invention, which includes stressors 60 for introducing desirable stresses to the channel region of the respective MOS device. Stressors 60 may include silicon carbon (SiC) if the respective MOS device is an NMOS device, or silicon germanium (SiGe) if the respective MOS device is a PMOS device. The formation of stressors 60 is known in the art, and hence is not repeated herein. Similar to the above-discussed embodiments, mask layer 32 is formed over gate stack 26 and stressors 60, with openings 34 adjacent the joint points 36. Halo/pocket regions 40 are formed through openings 34 using essentially the same method as described in the preceding paragraphs.

Although the formation of NMOS devices are discussed in the preceding paragraphs, the teaching of the present invention is readily available for forming PMOS devices, with the types of the respective SDE regions, halo/pocket regions, and source/drain regions inverted.

By using the embodiments of the present invention, the sheet resistances of source/drain regions may be reduced. This is partially due to the fact that the halo/pocket impurity is partially masked by mask layer 32, and removed with the removal of mask layer 32. The adverse neutralization of the source/drain impurity by the halo/pocket impurity is thus reduced. Simulations are performed to compare the sheet resistances of embodiments of the present invention to that of conventional MOS devices, wherein the halo/pocket regions of the conventional MOS devices are formed without the masking of mask layer 32. The simulation results revealed the sheet resistances of the conventional PMOS and NMOS devices are about 190 ohm/sq and about 135 ohm/sq, respectively. As a comparison, the sheet resistances of the PMOS and NMOS embodiments of the present invention are reduced to about 159 ohm/sq and about 100 ohm/sq, respectively.

An additional advantageous feature of the present invention is that the majority of the source/drain regions (the regions underlying mask portions $32_1$) are free from the halo/pocket impurity, and the band-to-band tunneling leakage currents are thus reduced due to reduced leakage areas.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   forming a gate dielectric over a semiconductor substrate, wherein the semiconductor substrate and a sidewall of the gate dielectric has a joint point;
   forming a gate electrode over the gate dielectric;
   forming a mask layer over a source/drain area on the semiconductor substrate and on a sidewall of the gate electrode, the sidewall of the gate electrode aligning with the sidewall of the gate dielectric;
   etching the mask layer to have a first portion of the mask layer adjacent the joint point that is thinner than a second portion of the mask layer away from the joint point and the mask layer is continuous from the source/drain area to the sidewall of the gate electrode;
   after the step of forming the mask layer and while the mask layer is on the sidewall of the gate electrode, performing a halo/pocket implantation to introduce a halo/pocket impurity into the semiconductor substrate;
   removing the mask layer after the halo/pocket implantation; and after the step of removing the mask layer, forming a sidewall spacer along a sidewall of the gate electrode.

2. The method of claim 1, wherein after the halo/pocket implantation, in regions where the second portion of the mask layer exist, the halo/pocket impurity has a highest concentration in the mask layer, and the concentration gradually decreases down into the semiconductor substrate.

3. The method of claim 1, wherein after the halo/pocket implantation, in the semiconductor substrate, a highest concentration of the halo/pocket impurity is in a region close to an edge of the gate dielectric, and the concentration gradually decreases away from the edge of the gate dielectric toward a source/drain region.

4. The method of claim 1 further comprising:
   forming a source/drain extension (SDE) region adjacent the gate dielectric; and
   forming a source/drain region in the source/drain area adjacent the gate dielectric.

5. The method of claim 4, wherein the step of forming the SDE region is performed after the step of removing the mask layer.

6. The method of claim 4, wherein the step of forming the SDE region is performed before the step of forming the mask layer.

7. The method of claim 1, wherein the step of forming the mask layer comprises:
   blanket forming the mask layer.

8. The method of claim 7, wherein the step of blanket forming the mask layer comprises plasma enhanced chemical vapor deposition, and wherein the step of etching the first portion of the mask layer comprises an isotropic etching.

9. The method of claim 1, wherein after the step of etching the mask layer, a thickness of the first portion less than about 25 percent of a thickness of the second portion of the mask layer.

10. A method of forming a semiconductor structure, the method comprising:
    forming a gate dielectric over a semiconductor substrate, wherein the semiconductor substrate and a sidewall of the gate dielectric has a joint point;
    forming a gate electrode over the gate dielectric;
    blanket forming a mask layer to have a substantially uniform thickness over the gate electrode and over a source/drain area on the semiconductor substrate, the source/drain area being adjacent the joint point;
    etching the mask layer to remove a first portion of the mask layer adjacent the joint point, wherein a second portion of the mask layer remains over the source/drain area and a third portion of the mask layer remains over the gate electrode and on a sidewall of the gate electrode that aligns with the sidewall of the gate dielectric, wherein the first portion of the mask layer is thinner than the second portion of the mask layer and the third portion of the mask layer, and wherein the mask layer is continuous between the second portion of the mask layer and the third portion of the mask layer;
    performing a halo/pocket implantation while the first portion of the mask layer is thinner than the second portion of the mask layer and while the second portion of the mask layer is over the source/drain area and the third portion of the mask layer is over the gate electrode and on the sidewall of the gate electrode;
    removing the mask layer after the halo/pocket implantation; and
    forming a source/drain extension (SDE) region.

11. The method of claim 10, wherein the first portion of the mask layer has a width less than about ⅕ the spacing between neighboring parallel poly strips.

12. The method of claim 10, wherein after the halo/pocket implantation, in regions away from the joint point, a halo/pocket impurity has a highest concentration in the mask layer, and the concentration gradually decreases down into the semiconductor substrate.

13. The method of claim 10, wherein the step of blanket forming the mask layer comprises plasma enhanced chemical vapor deposition, and wherein the step of etching the mask layer comprises an isotropic etching.

14. A method of forming a semiconductor structure, the method comprising:
    forming a gate dielectric over a semiconductor substrate, wherein the semiconductor substrate and a sidewall of the gate dielectric has a joint point;
    forming a gate electrode over the gate dielectric;
    forming a mask layer over a source/drain area on the semiconductor substrate and on a sidewall of the gate electrode, the sidewall of the gate electrode aligning with the sidewall of the gate dielectric, the mask layer having a substantially uniform material composition:
    etching the mask layer to have a first portion of the mask layer adjacent the joint point that is thinner than a second portion of the mask layer away from the joint point and the mask layer is continuous from the source/drain area to the sidewall of the gate electrode;
    forming a source/drain extension (SDE) region in the semiconductor substrate and adjacent the gate dielectric, wherein the SDE region comprises a first impurity of a first conductivity type;
    after the step of forming the mask layer and while the mask layer is on the sidewall of the gate electrode, forming a halo/pocket region in the semiconductor substrate and adjacent the gate dielectric, wherein the halo/pocket region comprises a second impurity of a second conductivity type opposite the first conductivity type;
    after the step of forming the halo/pocket region, removing the mask layer;
    after the step of removing the mask layer, forming a sidewall spacer along a sidewall of the gate electrode and a surface of the gate dielectric; and
    forming a source/drain region proximate to the sidewall spacer, the source/drain region having a distal region and a proximal region, the proximal region being proximate the sidewall spacer, the distal region being distal from the sidewall spacer in a direction parallel to a top surface of the source/drain region, the proximal region being disposed between the sidewall spacer and the distal region, wherein in a direction orthogonal to the top surface of the source/drain region and from the top surface of the source/drain region into the proximal region of the source/drain region, a concentration of the second impurity decreases substantially gradually.

15. The method of claim 14, wherein the halo/pocket region extends further under the gate electrode than the SDE region.

16. The method of claim 14, wherein in the semiconductor substrate, the concentration of the second impurity is highest in a region close to an edge of the gate dielectric, and the concentration of the second impurity gradually decreases away from the edge of the gate dielectric toward the source/drain region.

17. The method of claim 14, wherein the source/drain region further comprises a stressor.

18. The method of claim 14 further comprising a source/drain silicide region over the source/drain region.

* * * * *

UNITED STATES PATENT AND TRADEMARK OFFICE
CERTIFICATE OF CORRECTION

| | | |
|---|---|---|
| PATENT NO. | : 8,822,293 B2 | Page 1 of 1 |
| APPLICATION NO. | : 12/048119 | |
| DATED | : September 2, 2014 | |
| INVENTOR(S) | : Yu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1513 days.

Signed and Sealed this
Eighteenth Day of August, 2015

Michelle K. Lee
*Director of the United States Patent and Trademark Office*